United States Patent [19]

Lakomy

[11] Patent Number: 4,458,214
[45] Date of Patent: Jul. 3, 1984

[54] FAST SAMPLING PHASE LOCKED LOOP FREQUENCY SYNTHESIZER

[75] Inventor: Paul E. Lakomy, Columbia, Md.

[73] Assignee: The Bendix Corporation, Southfield, Mich.

[21] Appl. No.: 305,816

[22] Filed: Sep. 28, 1981

[51] Int. Cl.$^3$ .............................................. H03L 7/18
[52] U.S. Cl. ..................................... 331/1 A; 331/10; 331/17
[58] Field of Search ..................... 331/1 A, 10, 11, 12, 331/17, 18, 20

[56] References Cited

U.S. PATENT DOCUMENTS 3,555,446  1/1971  Braymer ................................ 331/18

OTHER PUBLICATIONS

Bjerede, B. et al, "An Efficient Hardware Implementation For High Resolution Frequency Synthesis", Proceedings of the 30th Annual Symposium on Frequency Control, Atlantic City, N.J., Z-4, Jun. 1976, pp. 318–321.

Primary Examiner—Siegfried H. Grimm
Assistant Examiner—W. R. Paxman
Attorney, Agent, or Firm—W. G. Christoforo; Bruce L. Lamb

[57] ABSTRACT

The output frequency of a phase locked loop frequency synthesizer is measured by a counter which counts whole output cycles and a timer providing a signal proportional to a fractional output cycle during a sampling period. The counter output is stored into a latch at each sampling period. Calculated frequency is generated by an accumulator which is incremented a selectable integer N at the completion of each sampling period. The accumulator output is divided into a first part relating to whole cycles and a second part relating to fractional cycles. An adder takes the difference of the latch stored number and the accumulator output first part. The resulting difference, with the accumulator output second part restored thereto, comprises a coarse error signal in digital form. The digital coarse error signal is converted to analog and applied as one input to a summer. A second input to the summer is provided by the timer signal after being scaled proportionately to N in a multiplying D/A converter. The summer output constitutes a refined error signal which is applied through a loop filter to regulate the output frequency of the phase locked voltage controlled oscillator.

8 Claims, 2 Drawing Figures

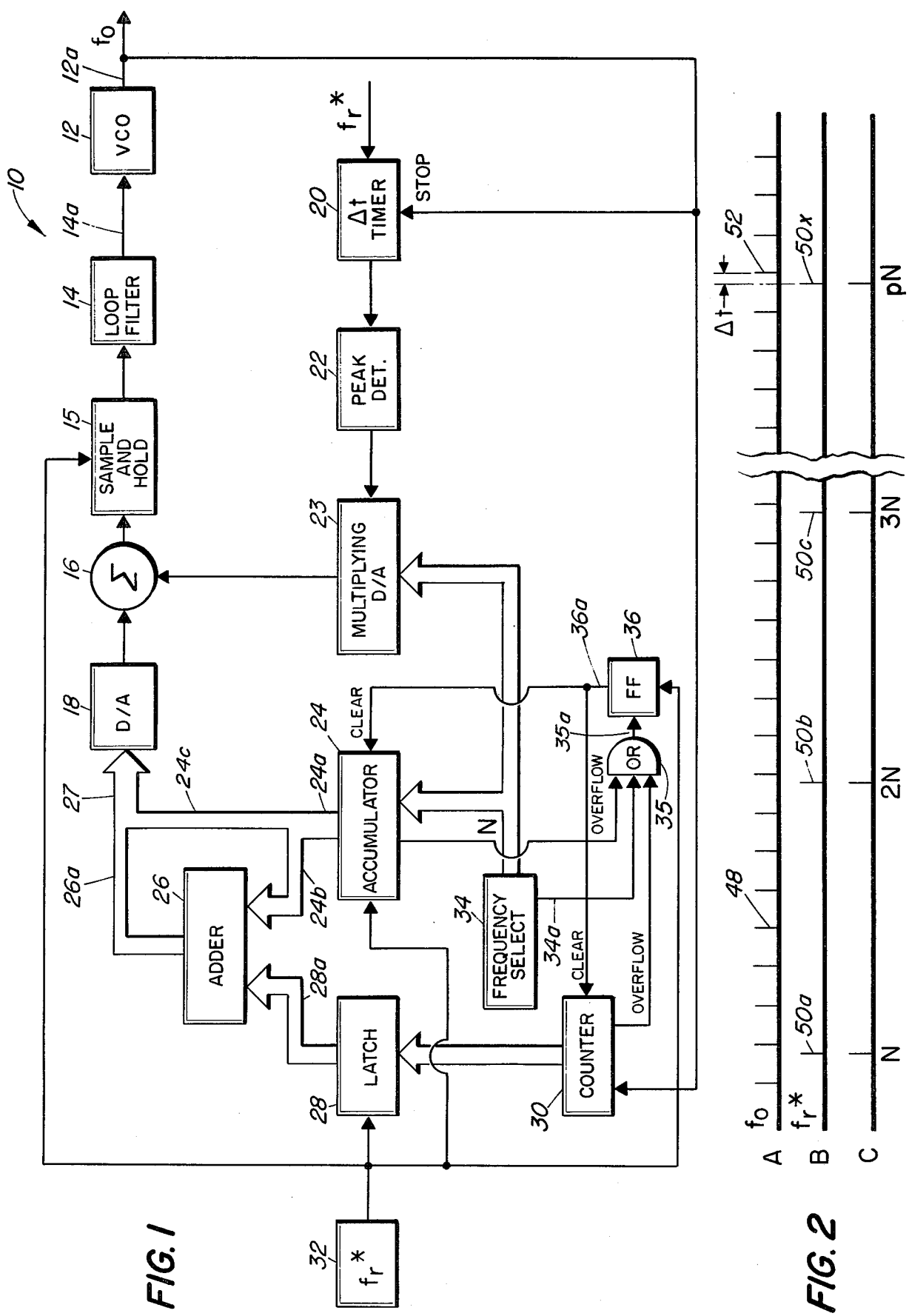

FAST SAMPLING PHASE LOCKED LOOP FREQUENCY SYNTHESIZER

BACKGROUND OF THE INVENTION

This invention relates to phase locked loop frequency synthesizers and particularly to such frequency synthesizers having a relatively high error sampling rate.

Phase locked loop frequency synthesizers are generally used in applications requiring a highly stable frequency source whose output frequency can be easily changed to one of several integral multiples of a given reference frequency. Briefly, a phase locked loop is comprised of a voltage controlled oscillator which generates the selected output frequency in response to an error signal applied thereto. The error signal is obtained by dividing the output frequency by a selected integer in a frequency scaler and comparing the resultant to the reference frequency in a phase comparator to obtain the error signal. In essence the output frequency $f_o$ is related to the reference frequency $f_r$ as folows:

$$f_o = Nf_r$$

where N is the selected integer. Thus, the phase locked output frequency is changed by simply changing N, the divider ratio of the frequency scaler.

The above mentioned means for generating multiples of the given reference frequency works well for many applications. Serious limitations, however, emerge when short frequency acquisition time and high spectral purity are required. To begin with, the voltage controlled oscillator is generally a non-linear device. This, coupled with the means typically used to implement a phase locked loop, creates a situation where it is difficult to lock the voltage controlled oscillator rapidly to different multiples of the reference frequency while maintaining a stable loop. Thus, it usually takes a number of reference frequency periods to acquire loop lock. The reason for this can be explained by considering the means for comparing phase difference between the scaled output frequency and the reference signal. In general, phase measurement is made according to one of several techniques, all of which are based upon a somewhat restrictive phase sampling scheme. More specifically, phase error measurements are made at discrete points in time and are delivered as error signals at a rate which is roughly equal to the reference frequency. What results, to a close approximation, is a sample data feedback system which operates at the reference frequency.

SUMMARY OF THE INVENTION

The present invention is a phase locked loop frequency synthesizer having a relatively high sampling rate. Such a frequency synthesizer will exhibit decreased output frequency acquisition time and improved stability. This new synthesizer will generate an output frequency $f_o$ which is an integral multiple of a fictitious reference frequency $f_r$ or:

$$f_o = Nf_r$$

This is the same relationship as found in the prior art. However, in the present case, the sample frequency $f_r^*$ is related to the reference frequency as follows:

$$f_r^* = Kf_r$$

where K is a positive integer greater than 1 and preferably $$K = 2^m.$$

Briefly, the invention includes a relatively conventional voltage controlled oscillator which responds to a refined error signal to generate an output frequency $$f_o = Nf_r$$

where N is a positive integer and $f_r$ is a reference frequency. The reference frequency is related to a sampling frequency by another factor, K, which is also a positive integer as mentioned above. Basically, the actual output signal is measured and compared against a computed desired frequency to obtain the refined error signal. Measuring of the actual output signal frequency is accomplished by some means to count whole cycles of the output signal starting from some base and continuing over a plurality of sampling frequency periods. The desired frequency is computed by an accumulator which increments by a selected number n in stepwise fashion each sampling period starting from essentially the above mentioned base. At each sampling period the measured whole cycles are compared with the computed frequency to obtain a coarse error signal which has no element related to measured fractional cycles of the output signal. A fractional output cycle, that is, that portion of an output cycle that occurs subsequent to the beginning or ending of a sampling period, is measured and used to correct the coarse error signal to thereby generate the above mentioned refined error signal.

Where the accumulator is a binary digital counter, K is chosen, for convenience, to be $2^m$, where m is a positive integer. In addition, means are provided to selectably change N so as to thereby provide a frequency synthesizer having a plurality of possible output frequency signals available.

The main object of the invention is to provide a phase locked loop frequency synthesizer having a relatively high error sampling rate.

Another object of the invention is to provide a frequency synthesizer of the above type which operates in accordance with digital logic principles.

These and other objects of the invention will be explained and made clear below.

BRIEF DESCRIPTION OF THE DRAWINGS

FIG. 1 is a block diagram of the preferred embodiment of the invention.

FIG. 2 is a time diagram of various of the signals in the device of FIG. 1.

DESCRIPTION OF THE PREFERRED EMBODIMENT

Referring to FIG. 1 a digital phase locked loop frequency synthesizer 10 is comprised of a conventional voltage controlled oscillator 12 which generates on line 12a a selected output frequency signal $f_o$ in response to a refined error signal received from loop filter 14 via error line 14a. The synthesizer additionally comprises means for measuring output frequency $f_o$ including counter 30 for measuring whole cycles and timer 20 and digital/analog multiplier 23 for measuring fractional output cycles. An accumulator 24 generates a signal relating to calculated or desired output frequency. More specifically, the output frequency signal $f_o$ is applied to counter 30, preferably a digital counter, which in response thereto counts whole cycles of signal $f_o$ starting from the time a Clear signal on line 36a resets counter 30 to some base count, preferably zero. Periodically, at an $f_r^*$ rate, the number in counter 30 is stored into latch 28 in response to the $f_r^*$ signal received from fixed frequency source 32.

Accumulator 24, which is in the form of another digital counter, is arranged to increment by an integer N at evenly spaced points in time. In this embodiment accumulator 24 is incremented by N at the $f_r^*$ rate in response to the $f_r^*$ signal from source 32. Accumulator 24 is reset to some base or zero value in response to the Clear signal mentioned above on line 36a. The origin of the Clear signal will be explained below. The integer N is adjustable, in the preferred embodiment, and set into accumulator 24 by frequency select unit 34 which is simply some means for selecting N, such as a bank of switches, and which is calibrated in output freqency $f_o$.

In explaining the function of accumulator 24 one should first consider a signal of constant frequency. The phase of such a signal is a linear function of time. Furthermore, the time rate of change of phase is proportional to the signal frequency. Since the accumulator output described above is a stepwise linear function of time it may be interpreted as the sampled phase of a signal of constant frequency. In addition, since the accumulator generates a step each time it is incremented, the rate at which the accumulator is incremented is precisely the rate at which the accumulator produces phase samples.

Refer now to FIG. 2. At line A thereof the output frequency signal $f_o$ is seen to be comprised of a train of evenly spaced pulses 48. Sampling pulses at rate $f_r^*$ are seen at line B. The output of accumulator 24 is represented at line C where the accumulator output is incremented in stepwise fashion by N at each sampling pulse. For example, at consecutive sampling pulses 50a, 50b and 50c the accumulator output steps respectively from N to 2N to 3N. When the constants N and $2^m$ are selected so that N is divisible by $2^m$ without remainder, and when $f_o$ is in the locked condition, each $f_r^*$ pulse will be time coincident with an $f_o$ pulse; for example, pulses 50x and 52 will be aligned. When the constants N and $2^m$ are so selected that division of N by $2^m$ produces a fractional remainder, an $f_o$ pulse will be displaced in time an amount $\Delta t$ from an $f_r^*$ pulse, as shown by pulses 50x and 52. The phase difference between $f_o$ and $f_r^*$ represented by $\Delta t$ is proportional to the fractional remainder of $N/2^m$.

Since the stepwise linear function output generated by accumulator 24 has a time rate of change which is proportional to N, this accumulator output can be interpreted as the phase versus time behavior of a signal whose frequency is $Nf_r$, where $f_r$ is some constant reference frequency. As will be shown, $f_r$ is a fictitious frequency which is related to $f_r^*$.

Constant reference frequency $f_r$ is the same reference frequency which serves as the sampling rate for the prior art phase locked loop frequency synthesizers mentioned above. However, because the frequency synthesizer embodied in FIG. 1 has a sampling rate which is dependent upon the rate at which accumulator 24 is incremented, the sampling rate of the disclosed synthesizer can be and is increased to $Kf_r$, where K is an integer greater than one. Because of the binary nature of accumulator 24, integer K is preferably chosen to be of the form $2^m$, where m is also an integer greater than one. In other words, the sampling rate $f_r^*$ for frequency synthesizer 10 is chosen as $2^m f_r$. In that case, the ratio of the computed frequency, that is, the accumulator 24 output signal, to the sampling rate is $$Nf_r/2^m f_r.$$

Thus, there are $N/2^m$ computed accumulator output periods for each sample, where each accumulator output period is a computed period which corresponds to the period of output frequency $f_o$ when synthesizer 10 is close to lock or locked. After p integral sampling periods the number of computed periods is $$pN/2^m.$$

In binary form this number can be generated by computing the integer product pN and then shifting the implied decimal point m places to the left. Since the output of accumulator 24 is a binary number of the form pN its less significant m bits comprise the fractional portion of the computed frequency, or in other words, comprise the computed phase difference. The higher order bits of the accumulator 24 output comprise the number of whole cycles of computed frequency since the accumulator was last cleared.

Returning now to FIG. 1, the double lines connecting various of the blocks, for example lines 24a and 24b, connotes that a binary number is being communicated thereover. Thus, the binary number output of accumulator 24 is carried by lines 24a, but split so that the more significant bits thereof corresponding to whole cycles of computed frequency are applied to adder 26 via lines 24b and the m least significant bits, corresponding to computed fractional cycles or phase is carried on lines 24c. The 2's complement of the number stored in latch 28, which it will be remembered is a binary or digital number corresponding to the whole cycles of output frequency $f_o$ as measured by counter 30, is applied via lines 28a to adder 26 which takes the difference of the whole cycles of measured and computed frequency. Of course, when the synthesizer is close to a locked condition the measured and computed frequencies will be very close and the output from adder 26 on lines 26a will be zero. As can be seen, the m bits on lines 24c carrying computed phase are combined with lines 26a into lines 27. Thus, where the adder 26 output is zero, that is, close to synthesizer lock, the number carried on lines 27 will be dominated by the least significant m bits from lines 24c. If, however, the output of adder 26 is greater than zero, indicative that the synthesizer is not close to lock, the number on lines 27 will be dominated by the adder output on lines 26a.

The number or signal on lines 27 is a coarse error signal which is transformed to analog form by digital to analog converter 18. The resulting analog signal is applied to summer 16. It can be seen that this coarse error signal includes elements of computed whole cycles and a computed fractional cycle, or phase, from accumulator 24 and an element related to measured whole cycles from counter 30. This coarse error signal must be refined by a second error signal comprising an element relating to measured fractional cycles to produce a suitable error signal for VCO 12. Referring to FIG. 2, this element relating to measured fractional cycles, in this embodiment, is related to $\Delta t$, the time period subsequent to a sampling pulse, here pulse 50x, and the next output frequency pulse 52.

Referring again to FIG. 1, $\Delta t$ is measured by a $\Delta t$ timer 20. In this embodiment $\Delta t$ is measured by a capacitor which begins charging from a base value in response to each $f_r^*$ pulse and is stopped and discharged by the subsequent $f_o$ pulse. A peak detector 22 holds the peak capacitor voltage. Devices comprised of a charging capacitor timer and peak detector of the type here described are well known in the art.

Ideally, the above mentioned second error signal should be equal to $\Delta t$ $f_o$ where $f_o$ is constant over $\Delta t$. Of course, $f_o$ will be constant over $\Delta t$, however, measuring the frequency of the VCO for each measurement of the second error signal is a difficult matter under the present state of the applicable technology. Thus, in this embodiment, the second error signal is made equal to the product of $Nf_r$ and $\Delta t$. Of course, when the synthesizer is locked, $Nf_r$ is equal to $f_o$. The approximation of the second error or signal by use of the above described technique does not detract from the operation of the frequency synthesizer. The multiplication is performed by a standard digital/analog multiplier 23 which multiplies the analog signal from peak detector 22 corresponding to $\Delta t$ by the digital signal corresponding to N from frequency selection unit 34. Since $f_r$ is a constant it is introduced merely by scaling the results of the multiplication by conventional means.

The refined error signal from summer 16 is sampled at the sampling frequency $f_r^*$ by sample and hold circuit 15 from whence it is applied through loop filter 14 via line 14a to control voltage controlled oscillator 12.

Accumulator 24 and counter 30 are initialized or set to their initial values, suitably zero, when either element fills. In addition, the elements are initialized when N is changed. As previously explained, this initializing of accumulator 24 and counter 30 is in response to a Clear signal on line 36a which is generated as follows. Overflow signals from accumulator 24 and counter 30 are combined with a signal on line 34a from frequency select unit 34, which indicates a change in N, in OR gate 35. Thus, if either accumulator 24 or counter 30 fills, or N changes, OR gate 35 generates an output on line 35a which arms flip-flop 36. Upon the next $f_r^*$ pulse, flip-flop 36 generates the Clear signal on terminal 36a to initialize accumulator 24 and counter 30.

One skilled in the art, having read and understood the above embodiment of my invention, should now find it possible to construct various alterations and modifications therefore. I therefore claim as my invention the subject matter coming under the true spirit and scope of the appended claims.

The invention claimed is:

1. A phase locked loop frequency synthesizer comprising:
   oscillator means responsive to a refined error signal for generating an output frequency signal $Nf_r$, where N is a positive integer and $f_r$ is a reference frequency;
   a source of a sampling signal $Kf_r$ where K is a positive integer;
   means for generating a first signal representing the number of whole cycles of said output frequency signal generated since a reference time zero;
   means responsive to said sampling signal for sampling said first signal at the $Kf_r$ rate;
   means responsive to said sampling signal for generating a second signal representing a number which is incremented by N stepwise at said $Kf_r$ rate;
   means for dividing said second signal by K to obtain a first part representing whole cycles of a computed frequency signal and a second part representing a computed fractional part of a cycle of said computed frequency signal;
   means combining the sampled first signal with said first and second parts of said second signal to generate a coarse error signal;
   means for generating a third signal representing a measured fractional portion of a cycle of said output frequency signal occurring during a period of said sampling signal; and,
   means combining said third signal and said coarse error signal to generate said refined error signal.

2. The phase locked loop frequency synthesizer of claim 1 wherein K is chosen to be of the form $2^m$ where m is a positive integer.

3. The phase locked loop frequency synthesizer of claim 2 including means for changing the value of N.

4. The phase locked loop frequency synthesizer of claim 2 wherein said combining means comprises:
   means for summing said third signal and said coarse error signal;
   a sample and hold circuit means for sampling and holding the output of said means for summing at said $Kf_r$ rate, the held sample being said refined error signal.

5. A fast sampling digital phase locked loop frequency synthesizer comprising:
   a voltage controlled oscillator responsive to a refined error signal for generating an output frequency signal $Nf_r$, where N is a positive integer and $f_r$ is a reference frequency;
   a source of a sampling signal $2^m f_r$, where m is a positive integer;
   a digital counter for counting whole cycles of said output frequency signal to generate a first digital number;
   a digital accumulator for generating a second digital number which is incremented by N stepwise at said $2^m f_r$ rate;
   means for taking the difference of said first and second digital numbers at said $2^m f_r$ rate to thereby generate a third digital number having at least a part comprised of m bits representing a computed fractional part of a cycle of a computed frequency;
   means for generating a measured fractional cycle signal representing a measured fractional portion of a cycle of said output frequency signal occurring during a period of said sampling signal; and
   means combining said third digital number with the measured fractional cycle signal to generate said refined error signal.

6. The fast sampling digital phase locked loop frequency synthesizer of claim 5 wherein said means for generating a measured fractional cycle signal comprises:
   a timer responsive to said sampling signal and said output frequency signal for generating a time signal; and,
   means for taking the product of said time signal and N, said product being proportional to said measured fractional cycle signal.

7. The fast sampling digital phase locked loop frequency synthesizer of claim 6 including means for changing the value of N.

8. The fast sampling digital phase locked loop frequency synthesizer of claim 7 wherein $2^m f_r$ is a constant frequency.

* * * * *